United States Patent
Park

(10) Patent No.: US 7,126,438 B2
(45) Date of Patent: Oct. 24, 2006

(54) CIRCUIT AND METHOD FOR TRANSMITTING AN OUTPUT SIGNAL USING A MICROELECTROMECHANICAL SYSTEMS VARACTOR AND A SERIES INDUCTIVE DEVICE

(75) Inventor: Chul Hong Park, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/848,720

(22) Filed: May 19, 2004

(65) Prior Publication Data
US 2005/0258916 A1 Nov. 24, 2005

(51) Int. Cl.
*H03H 7/38* (2006.01)

(52) U.S. Cl. .......................... 333/32; 333/33; 333/17.3; 333/263

(58) Field of Classification Search ................ 333/17.3, 333/32, 33, 263
See application file for complete search history.

(56) References Cited

U.S. PATENT DOCUMENTS

| | | | |
|---|---|---|---|
| 5,424,691 A * | 6/1995 | Sadinsky | 333/17.3 |
| 6,259,334 B1 * | 7/2001 | Howald | 333/17.3 |
| 6,329,886 B1 * | 12/2001 | Ogoro | 333/32 |
| 6,331,815 B1 * | 12/2001 | Oshima et al. | 333/32 |
| 6,437,649 B1 * | 8/2002 | Miyashita et al. | 330/302 |
| 6,441,449 B1 * | 8/2002 | Xu et al. | 257/414 |
| 6,577,155 B1 * | 6/2003 | Stewart et al. | 326/32 |
| 6,593,672 B1 * | 7/2003 | Ma et al. | 307/109 |
| 6,597,560 B1 * | 7/2003 | Potter | 361/277 |
| 6,635,919 B1 * | 10/2003 | Melendez et al. | 257/312 |
| 6,661,069 B1 * | 12/2003 | Chinthakindi et al. | 257/415 |
| 6,696,343 B1 * | 2/2004 | Chinthakindi et al. | 438/379 |
| 6,882,255 B1 * | 4/2005 | Mueller-Fiedler et al. | 333/262 |
| 6,897,537 B1 * | 5/2005 | de los Santos | 257/414 |
| 2004/0056733 A1 | 3/2004 | Park | |
| 2004/0150489 A1 * | 8/2004 | Driver et al. | 333/32 |
| 2005/0007291 A1 * | 1/2005 | Fabrega-Sanchez et al. | 343/860 |

\* cited by examiner

*Primary Examiner*—Robert Pascal
*Assistant Examiner*—Kimberly E Glenn

(57) ABSTRACT

A circuit and method for transmitting an output signal utilizes an inductive device connected in series with a microelectromechanical systems (MEMS) varactor to increase the potential difference across the MEMS varactor due to the output signal by introducing inductance-capacitance resonant behavior. The MEMS varactor is configured to be actuated exclusively by the output signal to effectuate a change in capacitance of the MEMS varactor. The MEMS varactor is used to provide a variable impedance transformation.

20 Claims, 6 Drawing Sheets

CIRCUIT AND METHOD FOR TRANSMITTING AN OUTPUT SIGNAL USING A MICROELECTROMECHANICAL SYSTEMS VARACTOR AND A SERIES INDUCTIVE DEVICE

BACKGROUND OF THE INVENTION

In a power amplifier of a cellular phone, an impedance transformation network is used to reduce the impedance of the load (often 50 Ohms) to a more optimal output impedance for an amplifier so that RF signals can be properly transmitted to the load. For a cellular phone that operates at a fixed transmission signal strength, the impedance transformation network needs to provide a fixed impedance transformation. However, for a cellular phone that operates at a number of different transmission signal strengths, such as a Code Division Multiple Access (CDMA) phone, the impedance transformation network needs to provide corresponding number of different impedance transformations.

An impedance transformation network can provide different impedance transformation using a shunt varactor as a variable capacitor. The shunt varactor may be a semiconductor varactor, a ferroelectric varactor or a microelectromechanical systems (MEMS) varactor. An advantage of a MEMS varactor in an impedance transformation network is that the response of a MEMS varactor with respect to change in capacitance is relatively slow compared to RF signals. Thus, the capacitance of the MEMS varactor is not significantly affected by the RF signals being transmitted through the impedance transformation network.

A typical MEMS varactor includes at least two separated parallel plates, a stationary plate and a movable plate. The movable plate is suspended over the stationary plate by a number of flexures that function as springs. The capacitance of the MEMS varactor is dependent on the distance between the plates. Thus, the capacitance of the MEMS varactor can be changed by moving the movable plate relative to the stationary plate, which is achieved by using electrostatic force generated from applied potential difference between the plates. In a conventional configuration, each plate of a MEMS varactor includes two electrodes. One of the plate electrodes is used to apply a control voltage to establish a particular potential difference between the plates to set the capacitance of the MEMS varactor to a desired setting. The other electrode is used to connect the MEMS varactor between the signal path on which RF signals are being transmitted and ground. In a non-conventional configuration, each plate of a MEMS varactor includes only one electrode. In this configuration, the root-mean-square (RMS) voltage of an RF signal is used to establish the potential difference between plates.

However, since cellular phones typically have a low battery voltage and a low RF power to actuate a MEMS varactor, the flexures of the MEMS varactor must be very responsive to the generated electrostatic force. As a result, the flexures of the MEMS varactor must be very thin and/or narrow. A concern with the use of such flexures is that the MEMS varactor may not be structurally stable, and thus, have reliability and repeatability issues.

SUMMARY OF THE INVENTION

A circuit and method for transmitting an output signal utilizes an inductive device connected in series with a microelectromechanical systems (MEMS) varactor to increase the potential difference across the MEMS varactor due to the output signal by introducing inductance-capacitance resonant behavior. The MEMS varactor is configured to be actuated exclusively by the output signal to effectuate a change in capacitance of the MEMS varactor. The MEMS varactor is used to provide a variable impedance transformation.

A circuit in accordance with an embodiment of the invention comprises a MEMS varactor and an inductive device. The MEMS varactor is connected to a signal path on which a non-static signal is transmitted. The MEMS varactor is configured to be actuated exclusively by the non-static signal to effectuate a change in capacitance of the MEMS varactor. The inductive device is connected in series with the MEMS varactor to introduce a series inductance to increase the potential difference across the MEMS varactor.

A circuit in accordance with another embodiment comprises an input node to receive an output signal, an output node to transmit the output signal, a fixed impedance transformation circuit connected between the input node and the output node, a MEMS varactor connected to the fixed impedance transformation circuit, and an inductor connected in series with the MEMS varactor. The fixed impedance transformation circuit is configured to provide a fixed impedance transformation to partially transform a first impedance at the output node to a second impedance at the input node. The MEMS varactor is configured to provide a variable impedance transformation to partially transform the first impedance at the output node to the second impedance at the input node.

A method for transmitting an output signal to an output node comprises receiving the output signal at an input node, and providing a variable impedance transformation between the input node and the output node using a MEMS varactor connected in series with an inductive device to partially transform a first impedance at the output node to a second impedance at the input node. The MEMS varactor and the inductive device introduce inductance-capacitance resonant behavior to increase a potential difference across the MEMS varactor caused by the output signal.

Other aspects and advantages of the present invention will become apparent from the following detailed description, taken in conjunction with the accompanying drawings, illustrated by way of example of the principles of the invention.

DETAILED DESCRIPTION

Figure 1:
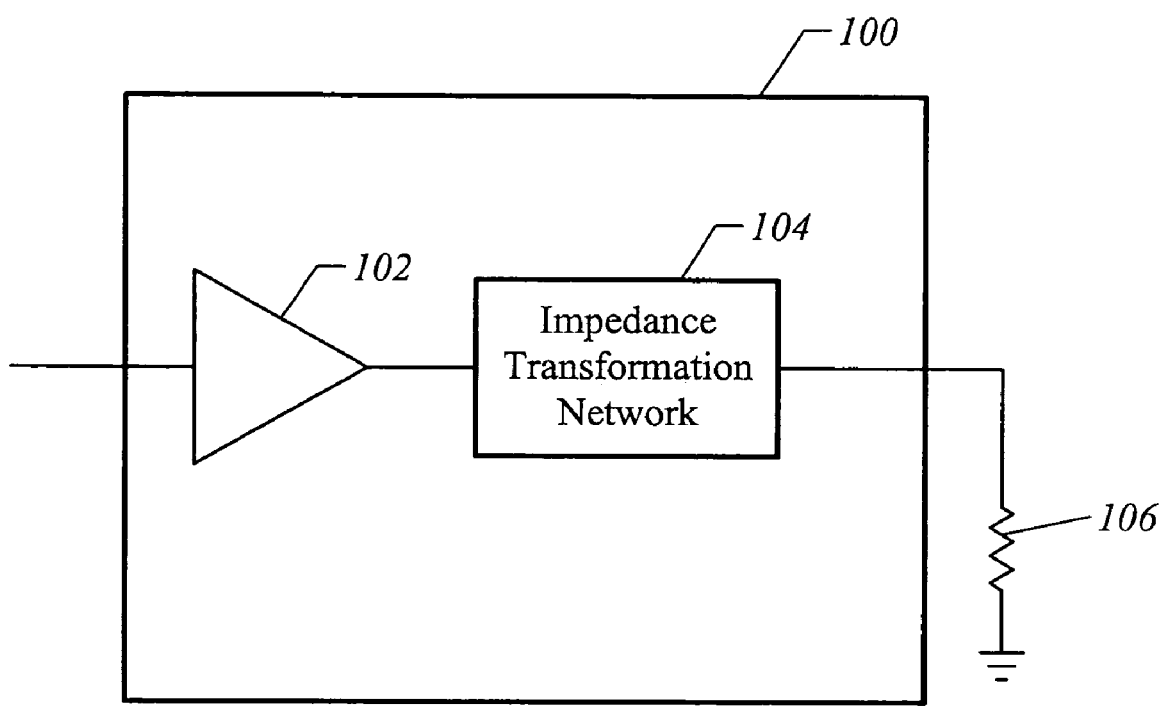
FIG. 1 is a block diagram of a radio frequency (RF) power amplifier including an impedance transformation network in accordance with an embodiment of the invention.

With reference to FIG. 1, a radio frequency (RF) power amplifier 100 in accordance with an embodiment of the invention is described. The RF power amplifier 100 may be used in a transmitter of a cellular phone to provide amplification of RF output signals being transmitted to the nearest cellular station. The RF power amplifier 100 transmits the output signals in variable strengths for use in cellular technologies that require such a technique, such as Code Division Multiple Access (CDMA) technology. Although the power amplifier 100 operates in the RF range in this embodiment, the power amplifier may operate in other frequency ranges in other embodiments.

As shown in FIG. 1, the RF power amplifier 100 includes an amplifier 102 and an impedance transformation network 104. The amplifier 102 receives and amplifies the RF output signals that are to be transmitted to a load, which is represented in FIG. 1 by a load resistor 106. The power level of the RF output signals is varied by an external device (not shown) to correlate the strength of the transmitted RF output signals with the current distance between the cellular phone embodying the RF power amplifier 100 and the nearest cellular station. As an example, the range of power for the RF output signals may be between 1 milliwatt to 1 watt.

The RF output signals from the amplifier 102 are transmitted to the load 106 through the impedance transformation network 104. The impedance transformation network 104 operates to transform the impedance of the load to a more optimal impedance for the amplifier 102. As an example, the load 106 may have an impedance of 50 Ohms. However, the amplifier 102 wants to "see" a significantly lower impedance than the load impedance, e.g., around 5 Ohms. Thus, the load impedance must be "transformed" to a more desired impedance so that the amplifier 102 can efficiently and optimally transmit the RF output signals to the load 106.

Figure 2:
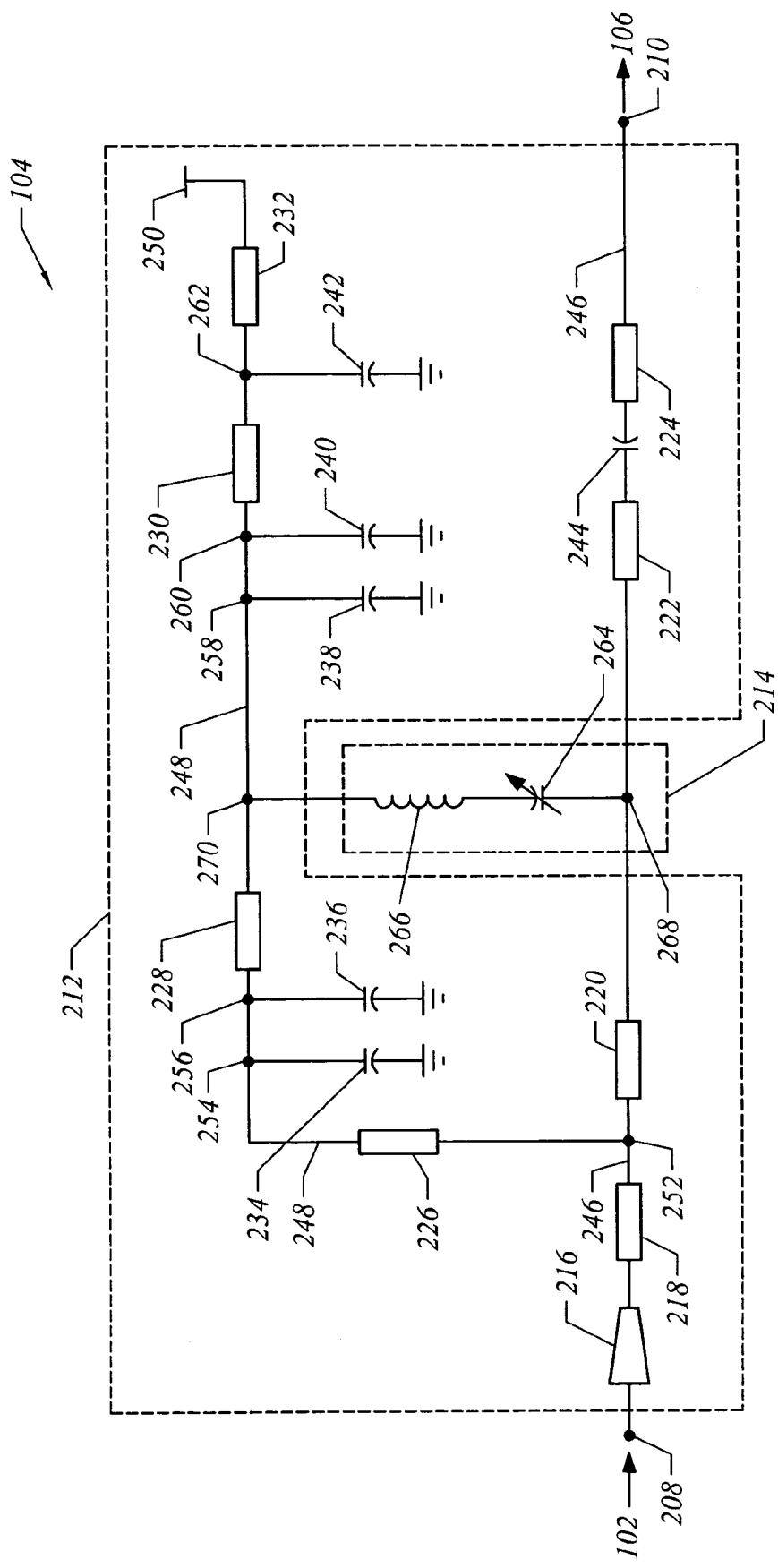
FIG. 2 is a diagram of the impedance transformation network of the RF power amplifier of FIG. 1 in accordance with an embodiment of the invention.

Turning now to FIG. 2, the impedance transformation network 104 in accordance with an embodiment of the invention is shown. The impedance transformation network 104 includes an input node 208, which is connected to the output of the amplifier 102, and an output node 210, which is connected to the load 106. The impedance transformation network 104 further includes a fixed impedance transformation circuit 212 and a variable impedance transformation circuit 214. The fixed impedance transformation circuit 212 provides a fixed impedance transformation regardless of the power level of the RF output signal from the amplifier 102 of the RF power amplifier 100. That is, the impedance transformation provided by the fixed impedance transformation circuit 212 is constant over the power level range of the RF output signals from the amplifier 102. In contrast, the variable impedance transformation circuit 214 provides a variable impedance transformation that is dependent on the power level of the RF output signal from the amplifier 102. That is, the impedance transformation provided by the variable impedance transformation device 214 changes in response to the power level of the RF output signals from the amplifier 102.

As shown in FIG. 2, the fixed impedance transformation circuit 212 includes transmission lines 216, 218, 220, 222, 224, 226, 228, 230 and 232, shunt capacitors 234, 236, 238, 240 and 242, and a blocking capacitor 244. The transmission lines 216, 218, 220, 222 and 224 are located on a signal path 246 between the input node 208 and the output node 210 of the impedance transformation network 104. The transmission lines 226, 228, 230 and 232 are located on a signal path 248 between a node 252 on the signal path 246 and a high voltage terminal 250. The voltage terminal 250 provides a DC voltage for the amplifier 102 and the impedance transformation network 104. The shunt capacitor 234 is connected between a node 254 on the signal path 248, which is located between the transmission lines 226 and 228, and ground. The shunt capacitor 236 is connected between a node 256 on the signal path 248, which is located between the node 254 and the transmission line 228, and ground. The shunt capacitor 238 is connected between a node 258 on the signal path 248, which is located between the transmission lines 228 and 230, and ground. The shunt capacitor 240 is connected between a node 260 on the signal path 248, which is located between the node 258 and the transmission line 230, and ground. The shunt capacitor 242 is connected between a node 262 on the signal path 248, which is located between the transmission lines 230 and 232, and ground.

The transmission lines 216–232 provide connections between the output of the amplifier 102 and the load 106 and between the high voltage terminal 250 and the signal path 246. The transmission lines 216–232 are metal traces formed over a dielectric layer of a silicon substrate (not shown). The transmission line 216 is a tapered transmission line, while the transmission line 218 is a simple transmission line. The other transmission lines 220–232 are coplanar waveguides. The shunt capacitors 234–242 are realistic capacitors with parasitic resistance and parasitic inductance. As an example, the shunt capacitors 234–242 are surface mount technology (SMT) capacitors.

The transmission lines 226–232 on the signal path 248 and the shunt capacitors 234–242 contribute to the fixed impedance transformation provided by the fixed impedance transformation circuit 212. In addition, since the signal path 248 connects the signal path 246 to the high voltage terminal 250, DC voltage can be supplied to the signal path 246 via the signal path 248. The transmission lines 216–224 also contribute to the fixed impedance transformation provided by the fixed impedance transformation circuit 212. In addition, the transmission lines 216–224 provide harmonic tuning of the RF output signal from the amplifier 102.

The parameters of the transmission lines 216–232 and the capacitance, inductance and resistance values of the shunt capacitors 234–242 are chosen to set the fixed impedance transformation of the fixed impedance transformation circuit 212, which along with the variable impedance transformation of the variable impedance transformation circuit 214 provide the overall impedance transformation needed to transform the load impedance at the output node 210 to a more optimal impedance in the forward direction at the input node 208 for the amplifier 102. The forward direction is the direction from the input node 208 to the output node 210. As an example, the following table shows parameters that can be used for the transmission lines 216–232.

TABLE 1

| Transmission Line | Width | Length | Dielectric Thickness | Dielectric Constant |
|---|---|---|---|---|
| Transmission Line 216 | 65.9 mil and 19.2 mil | 41.1 mil | 11 mil | 3.8 |
| Transmission Line 218 | 19.3 mil | 183 mil | 11 mil | 3.8 |
| Transmission Line 220 | 19.3 mil | 98 mil | 11 mil | 3.8 |
| Transmission Line 222 | 19.3 mil | 390 mil | 11 mil | 3.8 |
| Transmission Line 224 | 19.3 mil | 180 mil | 11 mil | 3.8 |
| Transmission Line 226 | 10.9 mil | 53.1 mil | 11 mil | 3.8 |
| Transmission Line 228 | 21 mil | 100 mil | 11 mil | 3.8 |
| Transmission Line 230 | 21 mil | 200 mil | 11 mil | 3.8 |
| Transmission Line 232 | 21 mil | 400 mil | 11 mil | 3.8 |

As another example, the following table shows the capacitance, inductance and resistance values of the shunt capacitors 234–242.

TABLE 2

| Capacitor | Capacitance | Inductance | Resistance |
|---|---|---|---|
| Capacitor 234 | 10 pF | 0.7 nH | 400 mOhms |
| Capacitor 236 | 4700 pF | 1.7 nH | 400 mOhms |
| Capacitor 238 | 4700 pF | 1.7 nH | 400 mOhms |
| Capacitor 240 | 4700 pF | 1.7 nH | 400 mOhms |
| Capacitor 242 | 2.2 µF | 1.5 nH | 1000 mOhms |

The variable impedance transformation circuit 214 of the impedance transformation network 104 includes a MEMS varactor 264 and an inductor 266 that are connected in series between a node 268 on the signal paths 246 and a node 270 on the signal path 248. The node 268 is located on the signal path 246 between the transmission lines 220 and 222. The node 270 is located on the signal path 248 between the transmission line 228 and the node 258. The MEMS varactor 264 is directly connected to the signal path 246, while the inductor is directly connected to the signal path 248. Since DC voltage is applied to the signal path 248 through the high voltage terminal 250, the inductor 266 can be considered as being grounded with respect to RF signals. The MEMS varactor 264 provides a variable capacitance that is dependent on the power level of RF output signal being transmitted to the output node 210. The MEMS varactor 264 is actuated or controlled exclusively using the RF output signal from the amplifier 102, which is a non-static signal. Specifically, the root-mean-square (RMS) voltage of the RF output signal provides a potential difference across the MEMS varactor 264, which is used to create an attractive electrostatic force to change the capacitance of the MEMS varactor. Therefore, the MEMS varactor 264 does not require additional control signals to provide a potential difference to actuate the MEMS varactor. The series inductor 266 is used to introduce a resonant behavior that increases the potential difference in the MEMS varactor 264 due to the RMS voltage of the RF output signal, which creates a stronger attractive electrostatic force, as described in more detail below. It should be noted here that the DC potential difference across the MEMS varactor 264 should be much smaller than the RF voltage swing so that the RF output signal will control the MEMS varactor.

Figure 3:
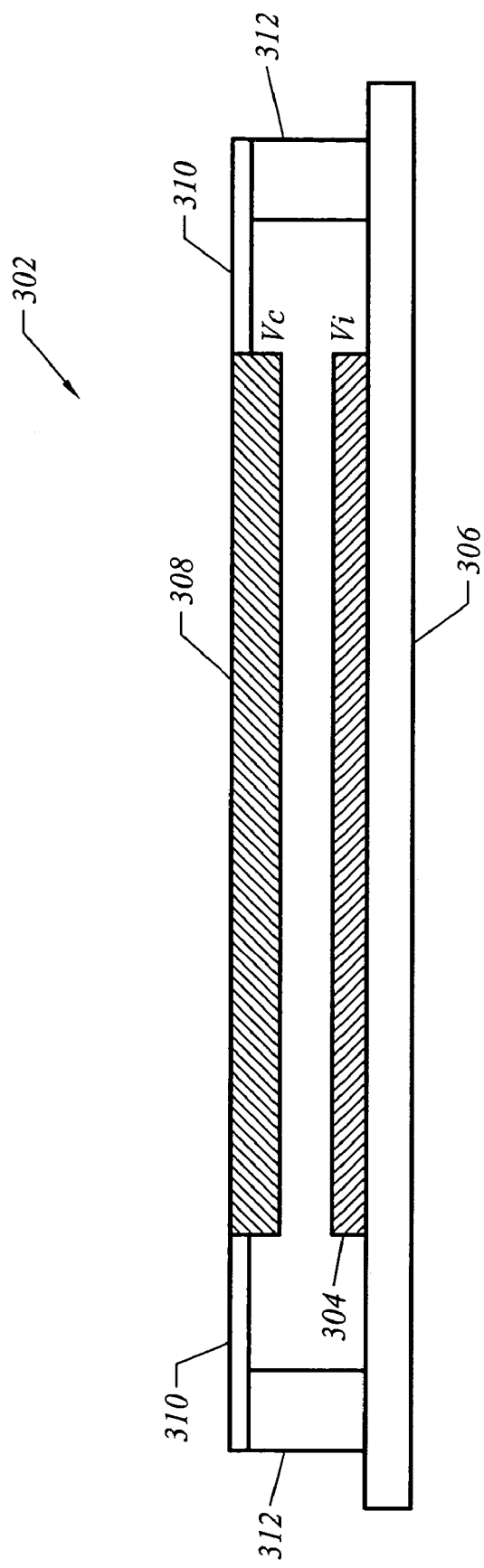
FIG. 3 is a diagram of a simple microelectromechanical systems (MEMS) varactor that can be used in a variable impedance transformation circuit of the impedance transformation network of FIG. 2.

Turning now to FIG. 3, a simple MEMS varactor 302 with two parallel plates that can be used as the MEMS varactor 264 of the variable impedance transformation circuit 214 of the RF power amplifier 100 is shown. However, the MEMS varactor 264 of the variable impedance transformation circuit 214 can be any type of MEMS varactors, such as those that use interdigitated electrodes and those that use more than two parallel plates. The MEMS varactor 302 includes a stationary plate 304 on a substrate 306 and a movable plate 308 held over the stationary plate by flexures 310 that are connected to supports 312 on the substrate. The flexures 310 function as springs to allow the movable plate 308 to be vertically moved relative to the stationary plate 304. The capacitance of the MEMS varactor 302 is dependent on the distance between the two plates 304 and 308. Thus, the capacitance of the MEMS varactor 302 can be varied by changing the distance between the two plates 304 and 308.

One of the plates 304 and 308 of the MEMS varactor 302 is electrically connected to the signal path 246, while the other plate is electrically connected to the inductor 266. As an example, the movable plate 308 is electrically connected to the signal path 246 and the stationary plate 304 is electrically connected to the inductor 266. However, the electrical connections of the two plates 304 and 308 can be reversed. When a potential difference is provided between the two plates 304 and 308, an attractive electrostatic force between the plates is generated, which can pull the movable plate 308 closer to the stationary plate 304. The voltage on the stationary plate 304 is indicated in FIG. 3 as Vi, while the voltage on the movable plate 308 is indicated as Vc. The amount of displacement of the movable plate 308 depends on the strength of the attractive electrostatic force between the plates 304 and 308, and thus, depends on the potential difference Vc−Vi between the plates. The sign of the potential difference does not matter since both negative and positive potential differences produce an attractive electrostatic force.

Figure 4A:
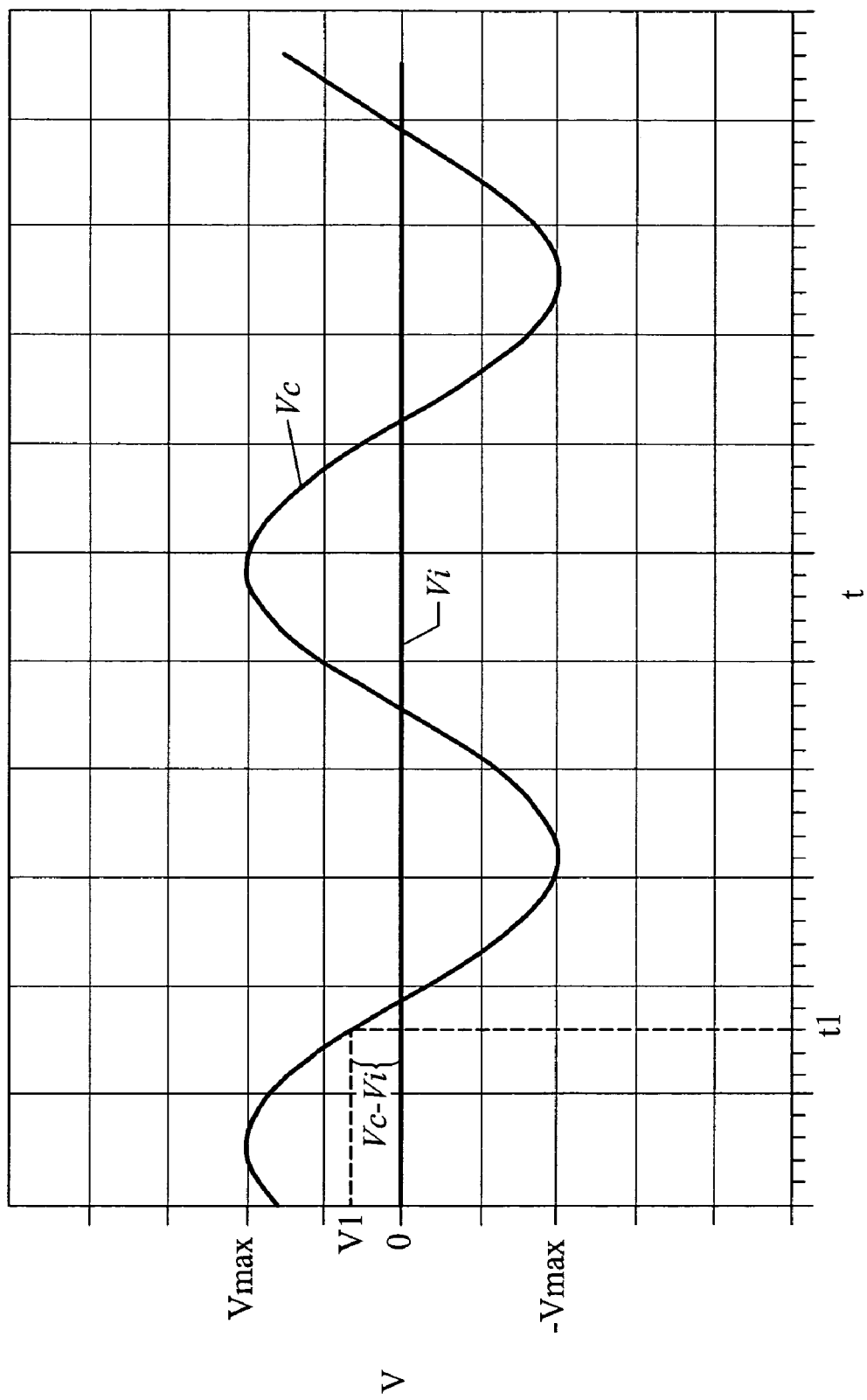
FIG. 4A is a plot of voltages on the MEMS varactor of FIG. 3 due to an RF signal when the MEMS varactor is directly connected to an effective ground.

Due to the series inductor 266, the potential difference between the plates 304 and 308 of the MEMS varactor 302 provided by the RF output signal is increased. This increase in the potential difference is described with reference to FIGS. 4A and 4B. In FIG. 4A, voltages Vc and Vi on the plates 308 and 304 of the MEMS varactor 302, respectively, due to an exemplary RF signal are illustrated when the MEMS varactor 302 is directly connected to the signal path 248, i.e., without the series inductor 266 of FIG. 2, and thus, is effectively grounded. As shown in FIG. 4A, the voltage Vc on the movable plate 308 of the MEMS varactor 302 due to the RF signal varies with time between approximately Vmax and −Vmax. However, the voltage Vi on the stationary plate 304 remains constant at zero volts since, in this example, the stationary plate is essentially connected to ground. Thus, the potential difference between the two plates 304 and 308 of the MEMS varactor 302 is Vc since Vi=0. As an example, at t=t1, the potential difference Vc−Vi between the two plates 304 and 308 is V1, as illustrated in FIG. 4A.

Figure 4B:
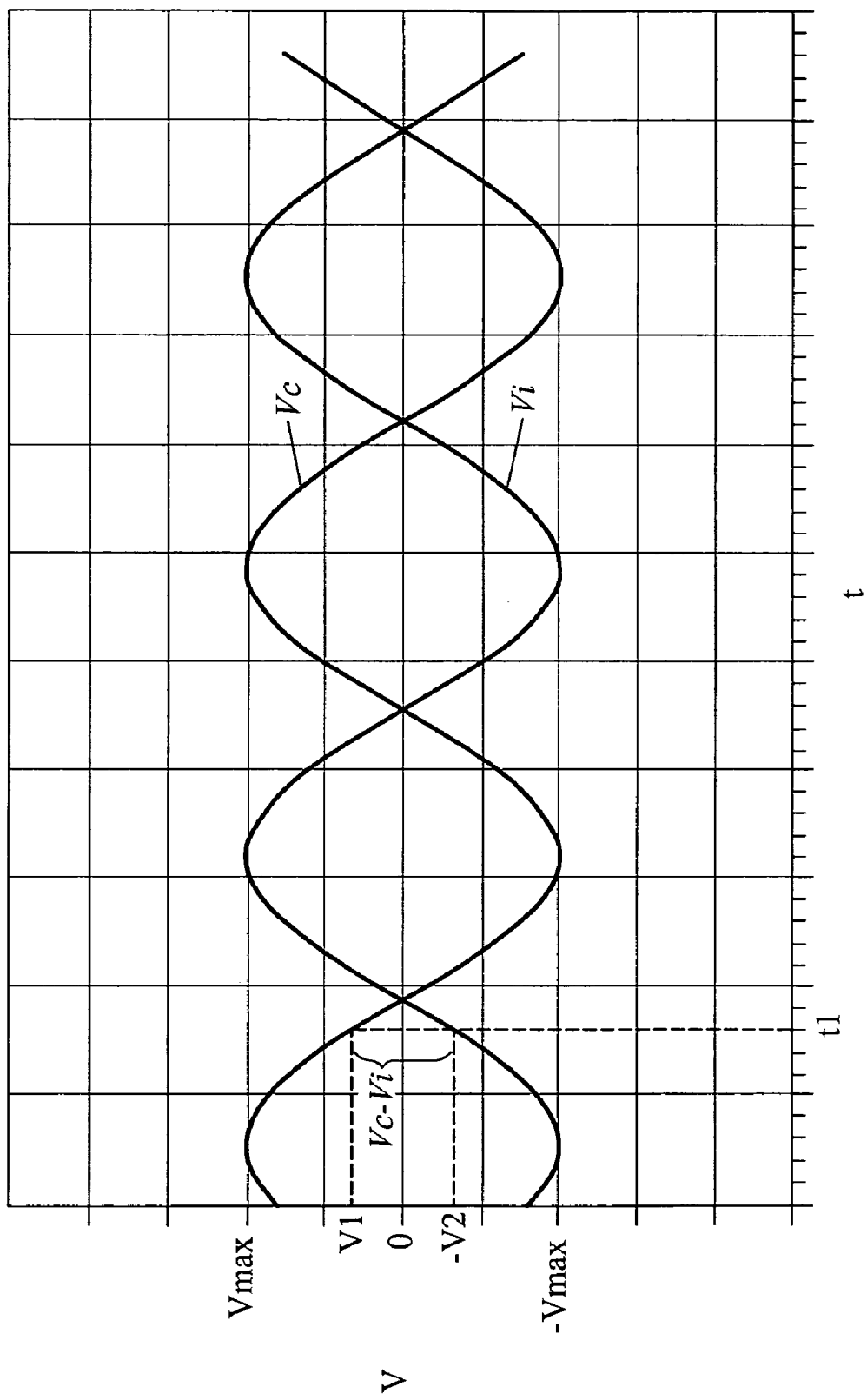
FIG. 4B is a plot of voltages on the MEMS varactor of FIG. 3 due to the same RF signal when the MEMS varactor is connected to a series inductor.

However, when a series inductance is introduced by an inductor connected in series with the MEMS varactor 302, as is the case for the variable impedance transformation circuit 214, the potential difference between the plates 304 and 308 of the MEMS varactor 302 due to the same exemplary RF signal is increased, as illustrated in FIG. 4B. In FIG. 4B, voltages Vc and Vi on the plates 308 and 304 of the MEMS varactor 302, respectively, due to the exemplary RF signal are illustrated when the MEMS varactor 302 is connected in series with an inductor. The voltage Vc on the movable plate 308 of the MEMS varactor 302 due to the RF signal is same as in FIG. 4A. However, the voltage Vi on the stationary plate 304 is not constant. Rather, due to a resonant behavior caused by the MEMS varactor 302 and the series inductor, the voltage Vi on the stationary plate 304 of the MEMS varactor somewhat mirrors the voltage Vc on the movable plate 308 of the MEMS varactor about the zero voltage level. Thus, the potential difference Vc−Vi between the plates 304 and 308 of the MEMS varactor 302 is increased. As an example, now at t=t1, the potential difference is V1−(−V2), which is greater than V1 since V2 is a negative voltage, as illustrated in FIG. 4B.

Since the potential difference provided by an RF signal between the plates 304 and 308 of the MEMS varactor 302 is increased by the series inductor, a stronger attractive electrostatic force can be generated by that potential difference. Consequently, the flexures 310 of the MEMS varactor 302 can be made to be studier so that the performance of the MEMS varactor 302 is improved with respect to repeatability and reliability. Furthermore, the MEMS varactor 302 with sturdier flexures 310 will be less susceptible to structural damage. These advantages can be applied to any type of MEMS varactor used in the variable impedance transformation circuit 214 of the RF power amplifier 100.

Figure 5:
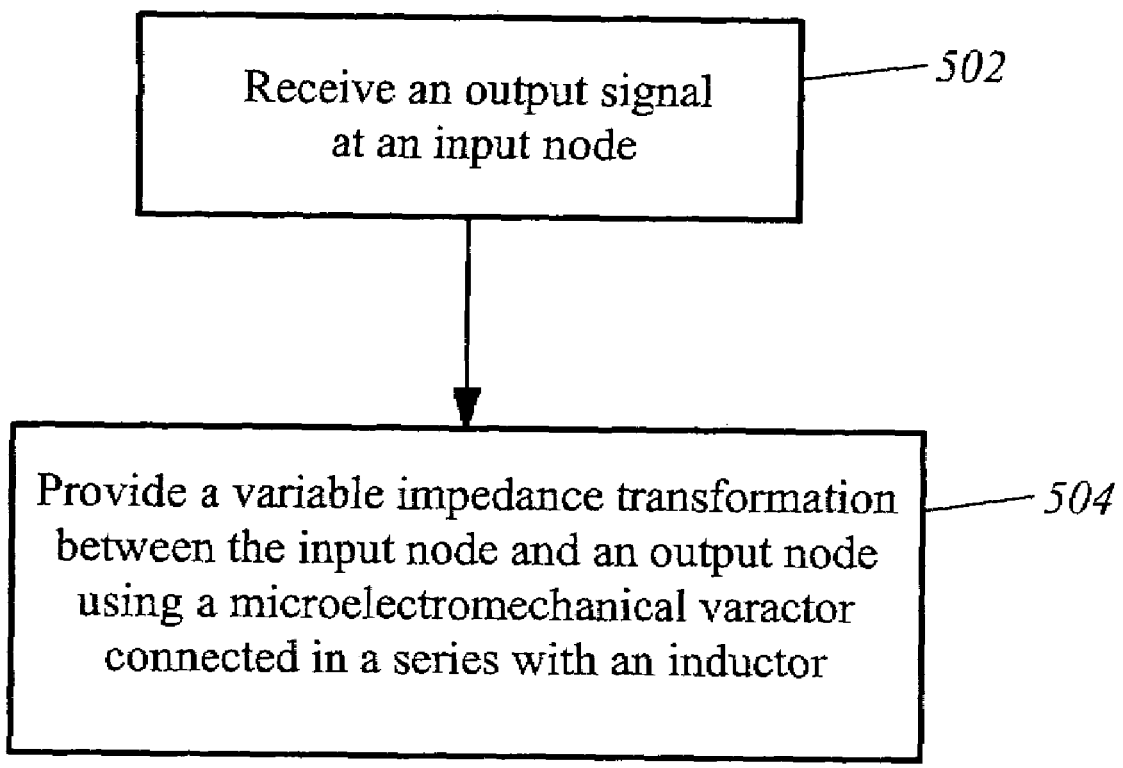
FIG. 5 is a flow diagram of a method for transmitting an RF output signal in accordance with an embodiment of the invention.

A method for transmitting an RF output signal to an output node is described with reference to a flow diagram of FIG. 5. At block 502, the RF output signal is received at an input node. As an example, the power level of the RF output signal may be between 1 milliwatt and 1 watt. Next, at block 504, a variable impedance transformation is provided between the input node and the output node using a MEMS varactor connected in series with an inductor. The MEMS varactor and the inductor introduce inductance-capacitance resonant behavior to increase a potential difference across the MEMS varactor caused by the output signal. The variable impedance transformation is provided in response to the power level of the RF output signal to transform a first impedance at the output node, e.g., the load impedance, to a second impedance at the input node in a forward direction from the input node to the output node, e.g., to a more optimal impedance for an amplifier providing the RF output signal.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit comprising:
a first signal path connecting an input node to an output node on which a non-static signal is transmitted;
a second signal path connecting a voltage terminal to the first signal path between the input node and the output node;
a microelectromechanical systems varactor connected to the first signal path between the input node and the output node, the micoroelectromechanical systems varactor being configured to be actuated exclusively by the non-static signal to effectuate a change in capacitance of the microelectromechanical systems varactor; and
an inductive device connected to the second signal path and connected in series with the microelectromechanical systems varactor to introduce a series inductance to increase a potential difference across the microelectromechanical systems varactor.

2. The circuit of claim 1 further comprising a fixed impedance transformation circuit connected between the input node, the output node and the voltage terminal.

3. The circuit of claim 2 further comprising an amplifier on the first signal path to provide the non-static signal.

4. The circuit of claim 3 wherein the non-static signal is a radio frequency signal.

5. The circuit of claim 2 wherein the fixed impedance transformation circuit includes at least one transmission line on the first signal path.

6. The circuit of claim 5 wherein the fixed impedance transformation circuit includes at least one additional transmission line on the second signal path between the voltage terminal and the first signal path and at least one shunt capacitor connected to the second signal path.

7. The circuit of claim 6 wherein the shunt capacitor of the fixed impedance transformation circuit is a surface mount technology capacitor.

8. The circuit of claim 1 wherein the microelectromechanical systems varactor includes a movable plate and a stationary plate.

9. A method for transmitting an output signal to an output node, the method comprising:
receiving the output signal at an input node; and
providing a variable impedance transformation on a first signal path connecting the input node and the output node using a microelectromechanical systems varactor connected in series with an inductive device to partially transform a first impedance at the output node to a second impedance at the input node, the microelectromechanical systems varactor being connected to the first signal path between the input node and the output node, the inductive device being connected to a second signal path connecting a voltage terminal to the first signal path between the input node and the output node, the microelectromechanical systems varactor and the inductive device introducing inductance-capacitance resonant behavior to increase a potential difference across the microelectromechanical systems varactor caused by the output signal.

10. The method of claim 9 wherein the providing of the variable impedance transformation includes actuating the microelectromechanical systems varactor using exclusively the output signal to effectuate a change in capacitance of the microelectromechanical systems varactor.

11. The method of claim 9 wherein the receiving of the output signal includes receiving a radio frequency output signal at the input node.

12. The method of claim 9 further comprising providing a fixed impedance transformation between the input node and the output node.

13. The method of claim 12 wherein the fixed impedance transformation is provided by at least one transmission line on the first signal path between the input node and the output node.

14. The method of claim 13 wherein the fixed impedance transformation is further provided by at least one additional transmission line on the second signal path between the voltage terminal and the first signal path and at least one shunt capacitor connected to the second signal path.

15. A circuit for transmitting an output signal comprising:
a first signal path connecting an input node to an output node;
a second signal path connecting a voltage terminal to the first signal path between the input node and the output node;
a fixed impedance transformation circuit connected between the input node, the output node and the voltage terminal, the fixed impedance transformation circuit being configured to provide a to fixed impedance transformation to partially transform a first impedance at the output node to a second impedance at the input node; and
a microelectromechanical systems varactor connected to the first signal path between the input node and the output node, the microelectromechanical systems varactor being configured to provide a variable impedance transformation to partially transform the first impedance at the output node to the second impedance at the input node; and
an inductor connected to the second signal path and connected in series with the microelectromechanical systems varactor.

16. The circuit of claim 15 further comprising an amplifier connected to the fixed impedance transformation circuit to provide the output signal.

17. The circuit of claim 15 wherein the output signal is a non-static signal.

18. The circuit of claim 17 wherein the microelectromechanical systems varactor is configured to be actuated exclusively by the non-static signal to effectuate a change in capacitance of the microelectromechanical systems varactor.

19. The circuit of claim 15 wherein the fixed impedance transformation circuit includes at least one transmission line on the first signal path between the input node and the output node.

20. The circuit of claim 19 wherein the fixed impedance transformation circuit includes at least one additional transmission line on the second signal path between the voltage terminal and the signal path and at least one shunt capacitor connected to the second signal path.

* * * * *

UNITED STATES PATENT AND TRADEMARK OFFICE
CERTIFICATE OF CORRECTION

| | | |
|---|---|---|
| PATENT NO. | : 7,126,438 B2 | Page 1 of 1 |
| APPLICATION NO. | : 10/848720 | |
| DATED | : October 24, 2006 | |
| INVENTOR(S) | : Chul Hong Park | |

It is certified that error appears in the above-identified patent and that said Letters Patent is hereby corrected as shown below:

Column 8, Line 50, Claim 15, before "fixed" delete "to".

Signed and Sealed this

Eighth Day of June, 2010

David J. Kappos
*Director of the United States Patent and Trademark Office*